(12) United States Patent
Luzetsky et al.

(10) Patent No.: US 12,309,985 B2
(45) Date of Patent: May 20, 2025

(54) ELECTROMAGNETIC SHIELDING RECEPTACLE FORMED FROM A COMPOSITE LAMINATE HAVING INTERLAMINAR RESONANCE CHAMBERS

(71) Applicant: SURVICE Engineering Company, LLC, Belcamp, MD (US)

(72) Inventors: Harry Richard Luzetsky, Kennett Square, PA (US); Ellen Marie Phifer, Lincoln University, PA (US)

(*) Notice: Subject to any disclaimer, the term of this patent is extended or adjusted under 35 U.S.C. 154(b) by 232 days.

(21) Appl. No.: 18/201,812

(22) Filed: May 25, 2023

(65) Prior Publication Data

US 2024/0397684 A1    Nov. 28, 2024

(51) Int. Cl.
*H05K 9/00*    (2006.01)

(52) U.S. Cl.
CPC ......... *H05K 9/0047* (2013.01); *H05K 9/0088* (2013.01); *H05K 9/009* (2013.01)

(58) Field of Classification Search
CPC ..... H05K 9/0047; H05K 9/0088; H05K 9/009
See application file for complete search history.

(56) References Cited

U.S. PATENT DOCUMENTS

| | | | |
|---|---|---|---|
| 5,100,737 A | * | 3/1992 | Colombier .............. C04B 41/52 428/614 |
| 6,258,457 B1 | * | 7/2001 | Ottinger ................. F16J 15/122 277/944 |
| 7,582,403 B2 | | 9/2009 | Bailey et al. |
| 7,901,596 B2 | | 3/2011 | Bailey et al. |
| 8,440,383 B2 | | 5/2013 | Bailey et al. |
| 11,160,200 B2 | | 10/2021 | Howland |
| 2010/0300744 A1 | | 12/2010 | Romanko et al. |
| 2015/0174860 A1 | | 6/2015 | Ellis et al. |
| 2016/0279900 A1 | * | 9/2016 | Fujiwara ................ H01L 23/552 |
| 2021/0385983 A1 | * | 12/2021 | Wu ....................... H05K 9/0084 |
| 2022/0097353 A1 | * | 3/2022 | Nakanishi ............ H05K 9/0096 |

* cited by examiner

*Primary Examiner* — Sherman Ng
(74) *Attorney, Agent, or Firm* — Peter Loffler

(57) ABSTRACT

A receptacle that houses electrical and electronic components and shields the components from harmful electromagnetic radiation uses a series of interspersed graphite layers with metal mesh and/or metal-coated carbon fiber layers in overlapping tape format that are fused together to form a laminate. In addition to the electromagnetic radiation absorption occasioned by the metal mesh layers, resonance chambers are formed within the laminate between adjoining metal mesh layers. The resonance chambers are tuned such that waves of certain frequencies are reflected away from the internal chamber of the receptacle while other wave frequencies are resonated within the resonance chambers. This allows the components of the receptacle to be shielded from incoming belligerent waves while allowing the dispatch of useful outgoing waves.

11 Claims, 3 Drawing Sheets

ELECTROMAGNETIC SHIELDING RECEPTACLE FORMED FROM A COMPOSITE LAMINATE HAVING INTERLAMINAR RESONANCE CHAMBERS

This invention was made with U.S. Government support under Agreement No. W9124P-19-9-0001 awarded by the Army Contracting Command-Redstone Arsenal to the AMTC. The Government has certain rights in the invention.

BACKGROUND OF THE INVENTION

1. Field of the Invention

The present invention relates to a multi-functional structural fiber-reinforced composite receptacle with integral electromagnetic shielding for containment of electrical and electronic systems wherein the receptacle shields the systems from harmful electromagnetic radiation and wherein the receptacle is formed from a laminar composite wherein interlaminar resonance chambers are formed that shield the systems from the harmful radiation and are tuned to the specific belligerent and friendly electromagnetic wavelengths of concern for appropriate disposition of the respective wave.

2. Background of the Prior Art

Harmful electromagnetic radiation can adversely affect electrical and electronic systems and can be detrimental to such systems' functionality, including systems that affect the safe operation or mission capability of a vehicle platform. Electromagnetic radiation can be introduced from a variety of sources such as high-power radio frequency radiation, high-power microwave radiation, lightning, and electromagnetic pulses, among others. Operation of the electrical and electronic systems within a vehicle or platform can also produce interference between such systems. Such radiation can produce upsets and hard faults within the electrical and electronic systems, which may result in permanent and possibly catastrophic damage to the circuits, subsystems, and the platform or vehicle itself.

To combat the harmful effects of electromagnetic radiation, sensitive electrical and electronic systems are held within a shielded enclosure, commonly metal, that functions as a Faraday cage and shields its contents from the harmful radiation. The enclosure also provides general mechanical protection for its contents. These enclosures provide a support structure for the electrical and electronic systems while isolating the internal emissions created by such systems as well as shielding such systems from external sources of electromagnetic radiation.

While effective, such Faraday cage systems are non-contributory to platform structure and are typically formed of metal, are heavy, with the added weight being quite taxing on vehicle performance and payload capability, particularly for airborne vehicle platforms which need to sacrifice aerodynamic performance and decreased payload capacity as a result of the increased weight. Additionally, such systems are limited in their functionality by material selection, wall thickness, and assembly architecture.

To address the concerns, particularly the issue of weight, polymeric materials with interspersed conductive fillers and exterior coatings have been developed to provide some level of electromagnetic shielding. Unfortunately, such systems fail to offer the superior electromagnetic shielding and robustness offered by their heavy metallic counterparts resulting in limited functionality and usage.

Accordingly, there is a need in the art for a material that addresses the above stated shortcomings found in the art and that provides a material used to create structures that surround electrical and electronic systems while providing electromagnetic shielding for the structure's contents. Such a material and the enclosure formed therefrom, must provide electromagnetic shielding and structural robustness such that the electromagnetic shielding provided is equivalent, at a minimum, to its primarily metal-based counterpart while being substantially lighter relative to the metal counterpart for a given sized structure.

SUMMARY OF THE INVENTION

The electromagnetic shielding receptacle formed from a composite laminate having interlaminar resonance chambers of the present invention addresses the aforementioned needs in the art by providing a composite laminate material that is substantially lighter than a primarily metal material for a given unit of material, wherein a structure formed from the material has similar or superior electromagnetic shielding and structural properties relative to its heavier metal counterpart. Varying the specific architecture of the material allows for tuning of the electromagnetic shielding properties of the material and the receptacle formed therefrom and can therefore be used as a structural alternative for a platform primary structure with integrated electromagnetic shielding.

The electromagnetic shielding receptacle formed from a composite laminate having interlaminar resonance chambers of the present invention is comprised of a receptacle that has an interior space and an outer surface. The receptacle is formed of a thermoplastic matrix composite laminate comprised of a series of graphite layers and metal mesh layers (this term includes metal coated carbon fiber mesh) such that the series of graphite layers and the series of metal mesh layers within the laminate form a series of interlaminar resonance chambers which tune the electromagnetic shielding characteristics to specific frequencies. The resulting structure possesses Faraday cage properties for the interior space of the receptacle such that for an incoming incident wave of a first frequency entering the laminate via the laminate's outer surface, at least a first portion of the electromagnetic radiation of the incident wave is absorbed by the metal mesh layers and a second portion of the incoming wave is internally reflected within the resonance chambers and exits the laminate via the outer surface as a reflected wave loss. For an outgoing incident wave of a second frequency that is different relative to the first frequency entering the laminate, at least a third portion of the electromagnetic radiation of the outgoing wave passes directly through the laminate and exits the laminate through the laminate's outer surface and a fourth portion of the outgoing wave is internally reflected within the resonance chambers and exits the laminate via the outer surface as a second transmission wave. The graphite and metal mesh layers exhibit greater electrical conductivity relative to the graphite layers alone. The depth and interlaminar position of the resonance chambers are configured to control electromagnetic frequency transmission. The depth and interlaminar position of the resonance chambers are configured to also control reflection of the laminate.

BRIEF DESCRIPTION OF THE DRAWINGS

Similar reference numerals refer to similar parts throughout the several views of the drawings.

DESCRIPTION OF THE PREFERRED EMBODIMENT

Figure 2:
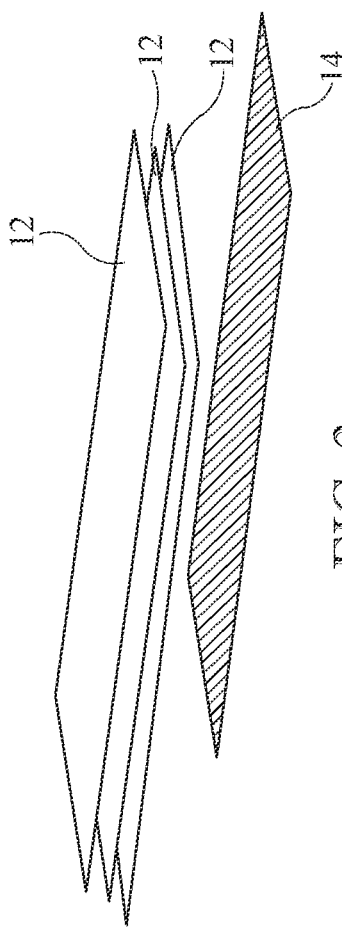
FIG. 2 is an exploded perspective view of the two different layers used to form the overall laminate of the electromagnetic shielding receptacle formed from a laminate having resonance chambers.
Figure 3:
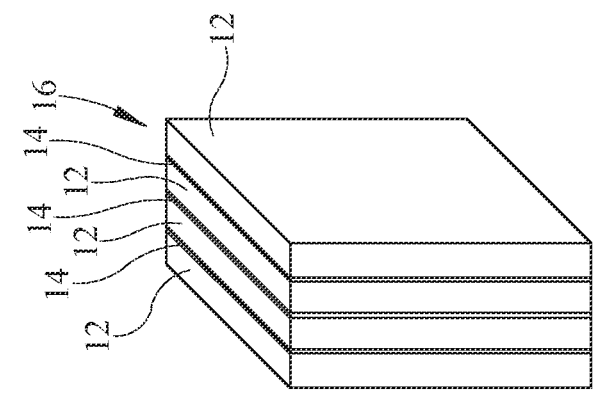
FIG. 3 is an enlarged view of a conductive layer in the formed laminate of the electromagnetic shielding receptacle illustrating conductive overlaps necessary for maintaining electrical conductivity in individual tape layers used in forming the laminate and defining resonance chambers.
Figure 1:
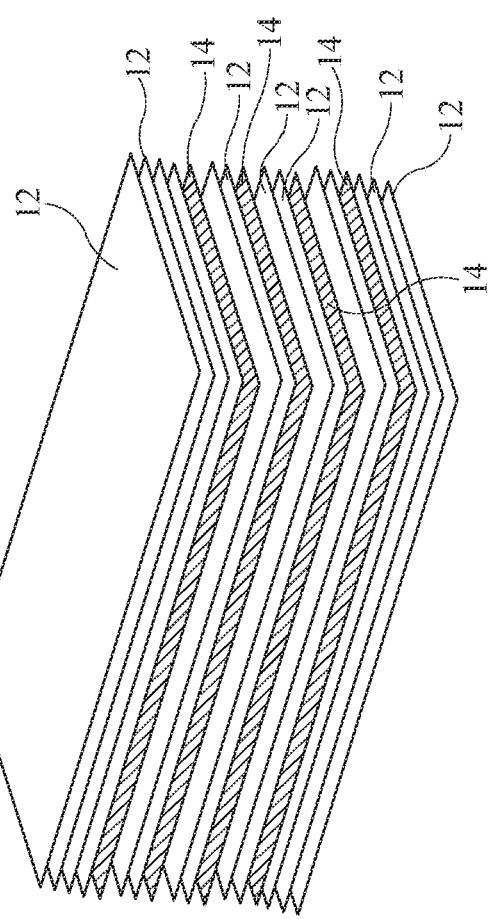
FIG. 1 is an exploded perspective view of the various layered composite used to form the electromagnetic shielding receptacle formed from a laminate having resonance chambers of the present invention.
Figure 5:
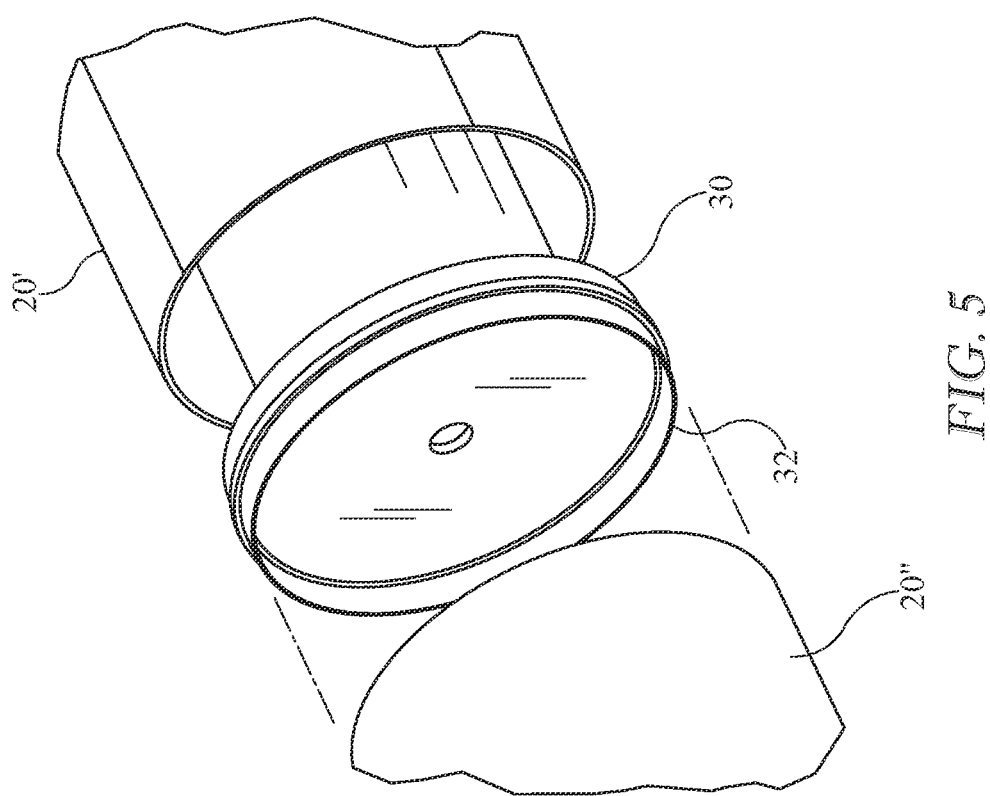
FIG. 5 is a close-up perspective view of an alternative architecture for an electromagnetic shielding receptacle formed from a composite laminate having resonance chambers serving a dual purpose of a structural body with integrated electromagnetic shielding to provide shielding for contained electronics.

Referring now to the drawings, it is seen that the electromagnetic shielding receptacle structure formed from a laminate having resonance chambers of the present invention, generally denoted by reference numeral 10, is comprised of, broadly, a high-pressure compacted graphite thermoplastic composite with discreetly placed layers of conductive materials. Basically, the electromagnetic shielding receptacle is formed from a laminate having resonance chambers 10 itself comprised of a series of graphite layers 12 or metal-coated carbon composite layers (for simplicity, the term graphite layer 12 also refers to the metal-coated carbon layer), interspersed with a series of metal mesh layers 14 that are subject to high compaction pressures and elevated process temperatures so as to be consolidated into a single, multi-ply laminate 16.

The graphite layers 12 are formed from carbon or graphite tape/PEEK. (polyetheretherketone) composite stacks. The graphite layers 12 are formed from various graphite fibers in tape format with an electrical conductivity that is at least as great as graphite. The fibers forming the graphite layers 12 can be of various graphite forms that allow discrete fiber orientation and may be coated with a conductive metal such as nickel-coated carbon. The graphite fibers must be compatible with the composite resin (PEEK) so as to support the high temperature and high-pressure compaction process that allows intimate contact and continuity between the resin and the various layers 12 and 14 that form the laminate 16.

The metal mesh layers 14 are also in tape form. Variability in mesh size, wire diameters of the metal mesh, and open areas of the metal mesh forming the metal mesh layer 14 as well as the relative orientation of the metal mesh 14 between the layers of the laminate 16 is contemplated to achieve the desired electromagnetic radiation shielding capabilities (as well as structural properties of the receptacle being formed). Careful placement and orientation of the metal mesh layers 14 is crucial to strong shielding performance. The metal mesh of the metal mesh layers 14 has greater electrical conductivity than the graphite layers 12.

As seen, once the laminate 16 is formed, a series of electromagnetic resonance chambers 18 are formed between the metal mesh layers 14. It is critical that there are no resin rich areas within the resonance chambers 18. The number of resonance chambers 18, the separation distance between the metal mesh layers 14, and the orientation of the base graphite layer 12 (outermost graphite layer 12) define the level of electromagnetic radiation shielding of the receptacle at specific frequencies. The parameters can each be individually manipulated to allow tuning of the electromagnetic shielding receptacle formed from a laminate having resonance chambers 10 integrated within the structural containment configuration to shield belligerent frequencies and allow other frequencies (such as a transmitted wave by the electronic component being shielded) to pass. The resonance chambers 18 work in conjunction with the graphite layers 12 to generate desired electromagnetic radiation shielding while minimizing interference with the functionality of the vehicle's electrical and electronic systems.

Figure 6:
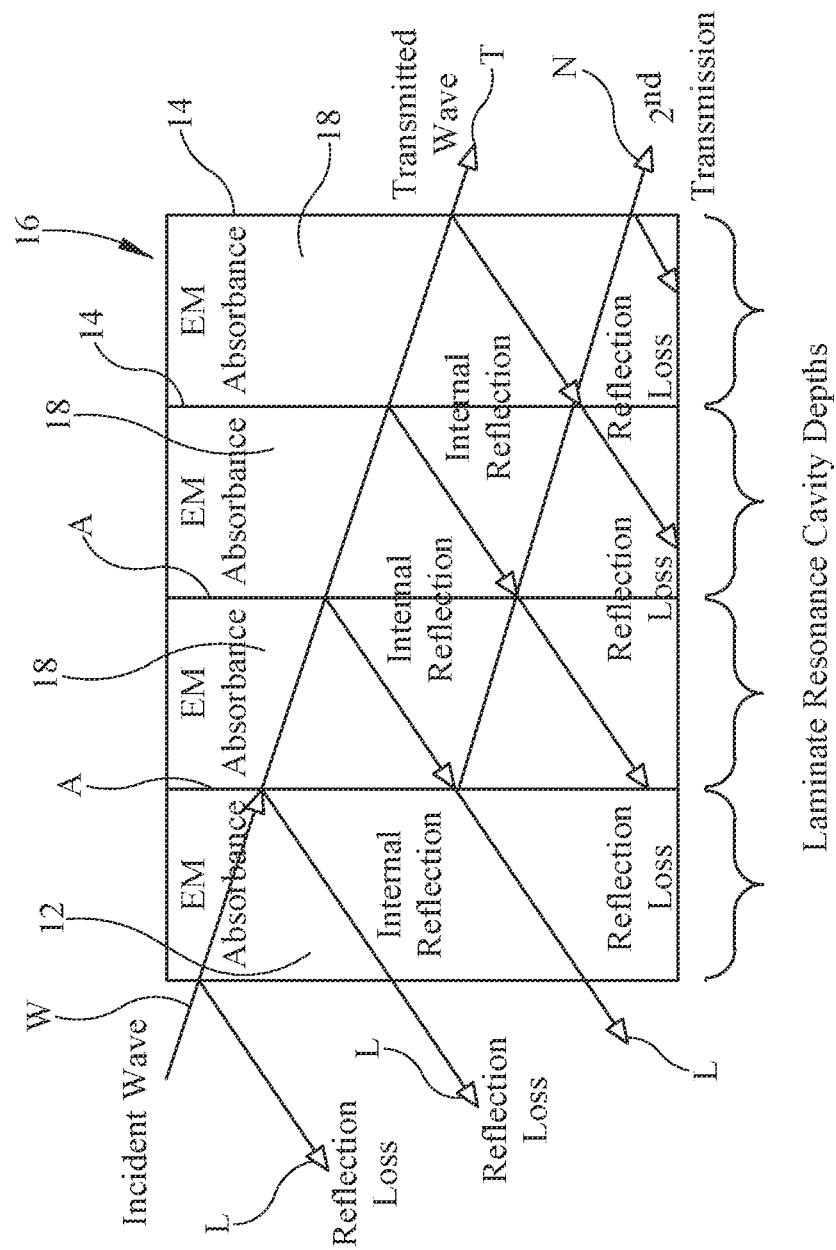
FIG. 6 is a schematic view of the resonance chambers formed by the laminate of the electromagnetic shielding receptacle formed from a laminate having resonance chambers.

As seen in FIG. 6, the resonance chambers 18 support multiple wave reflections therein. A belligerent incident wave W incoming through the outer surface formed by the laminate may undergo electromagnetic radiation absorption A by the metal mesh layers 14 upon entering the laminate 16. The metal mesh layers 14 also reflect the incident wave W within the resonance chambers 18 with such reflected wave exiting the laminate 16 through the outer surface of the receptacle as a reflected wave loss L. Alternately, for an incoming desired incident wave or an outgoing desired incident wave, a first portion of this wave passes through the laminate as a transmitted wave T with the remaining second portion of this wave resonating within the resonance chamber so as to be internally reflected R so as to result in one or more second transmission waves N of the desired incident wave W exiting the receptacle in the same direction as the first portion of this desired wave. These desired waves that resonate and form second transmission waves N are such as to be at a frequency that approaches about ½ of the resonance chamber 18 depth (distance between adjoining metal mesh layers 14). This resonation of the incident wave W and the reflection loss L of the incident wave W for a belligerent wave along with the direct electromagnetic radiation absorption A by the metal mesh layers 14, or the second transmission N for a desired incident wave W, allows for tailoring of the electromagnetic shielding receptacle formed from a laminate having resonance chambers 10 for the various waves of interest for a particular application. It is not necessary for the resonance chambers 18 within a single laminate to have uniform dimensions so that some resonance chambers can have greater distance between adjoining metal mesh layers relative to other resonance chambers.

Figure 4:
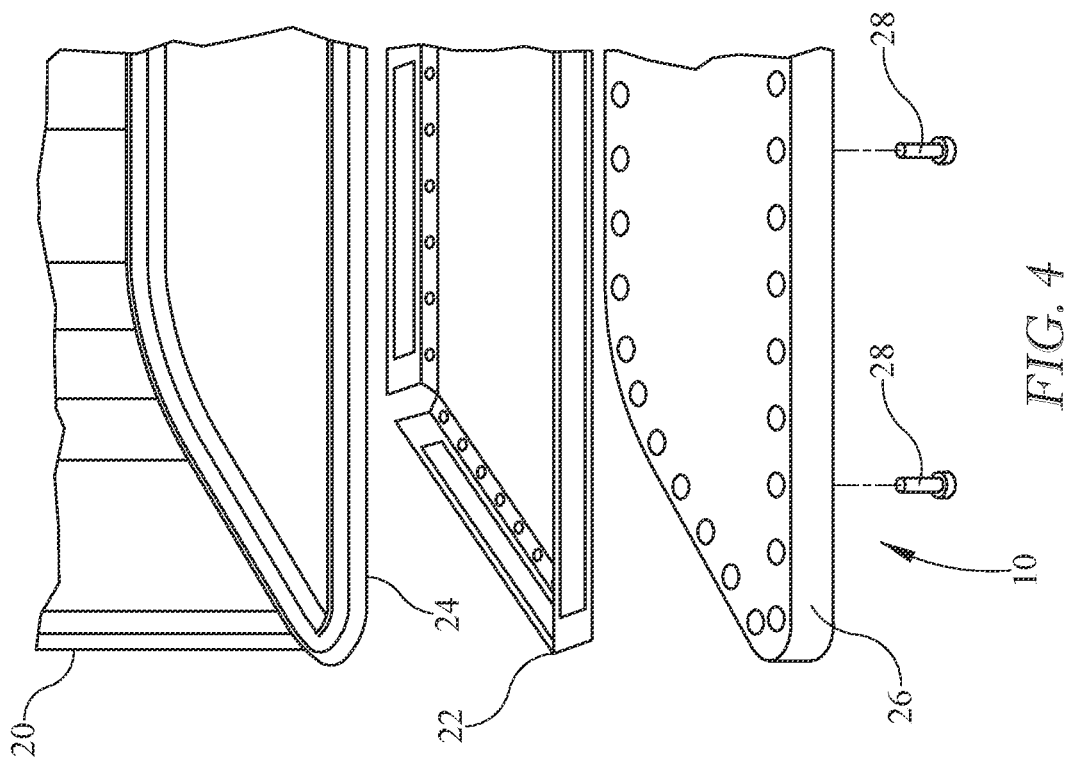
FIG. 4 is a close-up perspective view of a typical architecture for an accessible electronics receptacle formed from the multi-functional electromagnetic shielding composite formed from a laminate having resonance chambers.

As with any component structure, it is necessary to provide access to the interior of the receptacle formed while maintaining structural integrity. The electromagnetic shielding receptacle formed from a laminate having resonance chambers 10 is no different except for the need to provide isolation of any electromagnetic radiation sensitive equipment within the structure. For example, in the case of flat panel bonding, such as the generally rectangular receptacle 20 illustrated in FIG. 4, an angle frame 22 is seated and secured onto the lip 24 of the receptacle 20, the angle frame 22 being made from the same laminate 16 used to form the receptacle 20. Adherence of the angle frame 22 to the lip 24 of the receptacle 20 can be achieved in any appropriate fashion such as via adhesion bonding or a fusion process (magnetic induction, in-situ or applied heat, mechanical pressure, etc.). Thereafter, a lid 26 is placed onto the angle frame 24 and is secured thereto and to the main receptacle 20 via titanium fasteners 28 that pass through the lid 26, the angle frame 22 and into the receptacle 20.

Alternately, for a structural body, a flanged bulkhead 30 is attached to the main receptacle 20' in similar fashion used to attach the angle frame 24 to the previous receptacle 20. To support attachment of an additional structure 20'' to the main receptacle 20' a second flanged bulkhead 32 is secured to the interior of the first bulkhead 30, again in the manner previously described for attachment of the first bulkhead to the receptacle 20' and the angle frame 24 to the previous receptacle 20. This second bulkhead 32 acts as the support structure for the second structure 20''. Both bulkheads 30 and 32 are made from the same material used to form the laminate 16 thereby isolating internal electronics from electromagnetic radiation.

While the invention has been particularly shown and described with reference to an embodiment thereof, it will be appreciated by those skilled in the art that various changes in form and detail may be made without departing from the spirit and scope of the invention.

We claim:

1. A receptacle having an interior space and an outer surface, the receptacle being formed of a thermoplastic matrix composite laminate comprised of a series of graphite layers and a series of metal mesh layers such that the series of graphite layers and the series of metal mesh layers within the laminate forming a series of interlaminar resonance chambers which tune the electromagnetic shielding characteristics to specific frequencies such that the resulting structure possesses Faraday cage properties for the interior space and such that for an incoming incident wave of a first frequency entering the laminate via the laminate's outer surface, at least a first portion of the electromagnetic radiation of the incident wave is absorbed by the metal mesh layers and a second portion of the incoming wave is internally reflected within the resonance chambers and exits the laminate via the outer surface as a reflected wave loss and wherein for an outgoing incident wave of a second frequency that is different relative to the first frequency entering the laminate via the inner surface, at least a third portion of the electromagnetic radiation of the outgoing wave passes directly through the laminate and exits the laminate through the laminate's outer surface and a fourth portion of the outgoing wave is internally reflected within the resonance chambers and exits the laminate via the outer surface as a $2^{nd}$ transmission wave.

2. The receptacle as in claim 1 wherein the graphite layers and the metal mesh layers exhibit greater electrical conductivity relative to that provided by the graphite layers alone.

3. The receptacle as in claim 1 wherein the depth and interlaminar position of the resonance chambers are configured to control electromagnetic frequency transmission.

4. The receptacle as in claim 3 wherein the depth and interlaminar position of the resonance chambers are configured to also control reflection of the laminate.

5. The receptacle as in claim 1 wherein the depth and interlaminar position of the resonance chambers are configured to control reflection of the laminate.

6. A receptacle having an interior space and an outer surface, the receptacle being a thermoplastic laminate formed as a PEEK composite laminate with a metallic mesh interleaved with the graphite PEEK layers in the laminate, fused together to form the laminate such that a series of interlaminar electromagnetic resonance chambers is formed between the metal mesh layers within the laminate and such that the container possesses Faraday cage properties for the interior space and such that for an incoming incident wave of a first frequency entering the laminate via the laminate's outer surface, at least a first portion of the electromagnetic radiation of the incident wave is absorbed by the metal mesh layers and a second portion of the incoming wave is internally reflected within the resonance chambers and exits the laminate via the outer surface as a reflected wave loss and wherein for an outgoing incident wave of a second frequency that is different relative to the first frequency entering the laminate via the inner surface, at least a third portion of the electromagnetic radiation of the outgoing wave passes directly through the laminate and exits the laminate out through the laminate's outer surface and a fourth portion of the outgoing wave is internally reflected within the resonance chambers and exits the laminate via the outer surface as a second transmission wave.

7. The receptacle as in claim 6 wherein the graphite and metal mesh layers exhibit greater electrical conductivity relative to that provided by the graphite layers alone.

8. The receptacle as in claim 4 wherein the depth and interlaminar position of the resonance chambers affects electromagnetic shielding effectiveness as a function of frequency.

9. A receptacle comprising a series of PEEK composite layers and a series of metal mesh layers interleaved with the PEEK layers fused into a single laminate such that the laminate is formed into a receptacle having an interior space bounded by the inner surface, the receptacle also having an outer surface, such that the receptacle possesses Faraday cage properties for the interior space such that the interlaminar location and number of metal mesh form a series of electromagnetic resonance chambers between the f metal mesh layers within the laminate such that for an incoming incident wave of a first frequency entering the laminate via the laminate's outer surface, at least a first portion of the electromagnetic radiation of the incident is absorbed by the metal mesh layers and a second portion of the incoming wave is internally reflected within the resonance chambers and exits the laminate via the outer surface as a reflected wave loss and wherein for an outgoing incident wave of a second frequency that is different relative to the first frequency entering the laminate via the inner surface, at least a third portion of the electromagnetic radiation of the outgoing wave passes directly through the laminate and exits the laminate through the laminate's outer surface and a fourth portion of the outgoing wave is internally reflected within the resonance chambers and exits the laminate via the outer surface as a second transmission wave.

10. The receptacle as in claim 9 wherein the metal mesh layers provide increased electrical conductivity to the laminate relative to that provided by the graphite layers alone.

11. The container as in claim 9 wherein the location and number of resonance chambers as defined by the location of the metal mesh layers in relation to the PEEK layers determine electromagnetic shielding response as a function of frequency.

* * * * *